United States Patent [19]

Gannyo et al.

[11] Patent Number: 5,408,384
[45] Date of Patent: Apr. 18, 1995

[54] ELECTRONIC CARD AND CONNECTOR DEVICE THEREFOR

[75] Inventors: Yoshimasa Gannyo, Hashima; Hiroyuki Yamada; Motoyoshi Kitagawa, both of Aichi, all of Japan

[73] Assignee: Matsushita Electric Industrial Co., Ltd., Osaka, Japan

[21] Appl. No.: 235,720

[22] Filed: Apr. 29, 1994

[30] Foreign Application Priority Data

May 13, 1993 [JP] Japan .................................. 5-111337
Mar. 16, 1994 [JP] Japan .................................. 6-045689

[51] Int. Cl.6 .................... H05K 5/00; H01R 23/70
[52] U.S. Cl. .................... 361/737; 361/752; 361/741; 361/756; 439/60; 439/62; 439/629; 439/630; 439/636; 235/380
[58] Field of Search ................. 361/728, 730, 736–737, 361/741, 752, 755–756; 439/59–60, 62, 374, 377, 629–630, 636; 235/380

[56] References Cited

U.S. PATENT DOCUMENTS 5,242,310  9/1993  Leung ................................ 361/737
5,299,940  4/1994  Uenaka et al. ......................... 439/76

Primary Examiner—Bot Ledynh
Attorney, Agent, or Firm—Stevens, Davis, Miller & Mosher

[57] ABSTRACT

In order to provide a small-sized card and a connector device therefor having no fear of damages and stains of terminals, the card according to the invention has a structure comprising a casing with an opening, and a double-faced substrate on which electronic parts are provided and a plurality of terminals are attached in the vicinity of one end of the substrate, in which the terminals are provided on both the upper and lower surfaces of the substrate, the lower surface of the substrate is disposed in contact with the inner surface of the casing, the terminals on the lower surface of the substrate are covered with a cover which is swung or slid to be opened/closed freely, so that when the card is inserted in a connector device, the cover is opened to expose the lower-surface terminals and to fit them closely in a connector of the connector device.

10 Claims, 5 Drawing Sheets

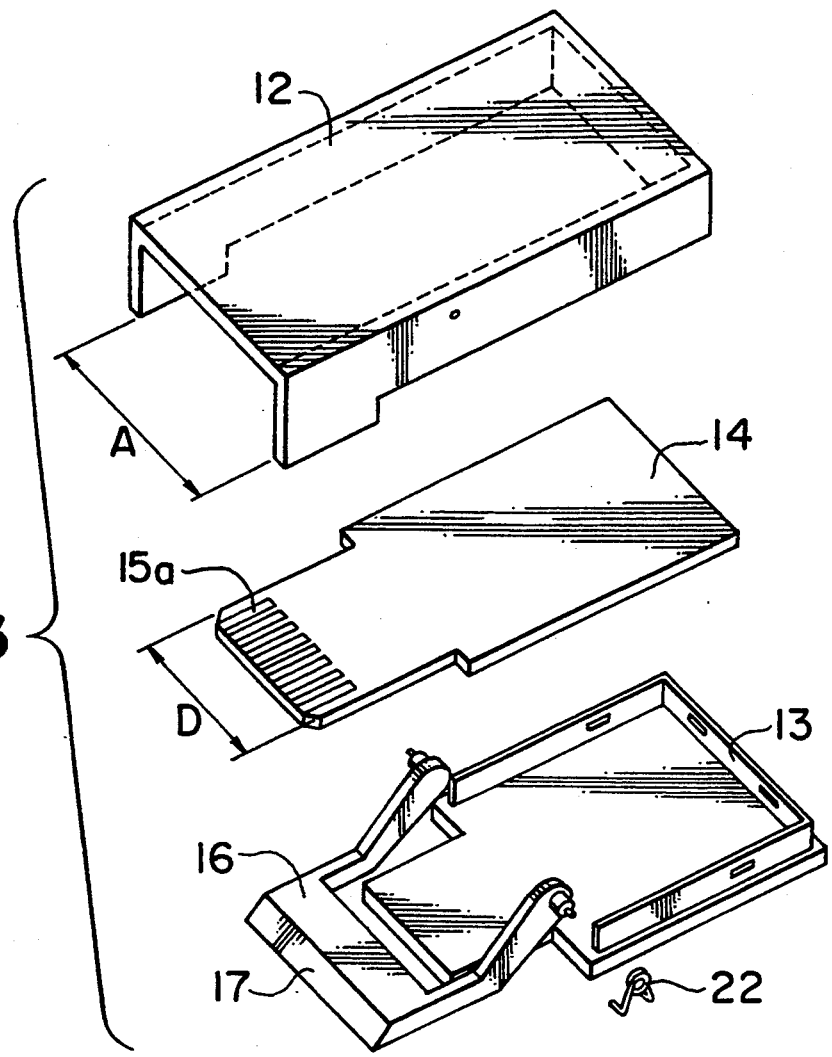
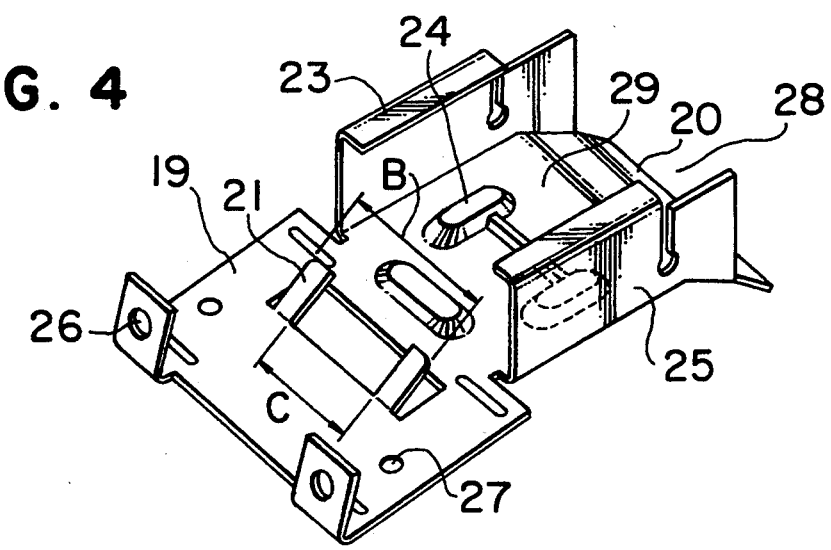

ELECTRONIC CARD AND CONNECTOR DEVICE THEREFOR

BACKGROUND OF THE INVENTION

The present invention relates to an electronic card and a connector device in which this electronic card is inserted.

Recently, there has been an increasing demand for size reduction and function multiplicity of an electronic equipment, and accordingly, there have been more examples in which a card serving as a functional module is attached to such an electronic equipment.

A conventional electronic card for use in a electronic equipment and a connector device in which this electronic card is inserted will be described below.

FIG. 10 is a cross-sectional view showing the conventional electronic card for use in the electronic equipment and the connector device in which the above card is inserted. In FIG. 10, reference numeral 1 denotes the card which has the following structure. An upper casing 2 and a lower casing 3 constitute casing means of the card 1. Reference numeral 4 denotes a double-faced substrate incorporated substantially in the center of the card 1, 5 denotes terminals provided on the double-faced substrate 4, and 6 denotes an edge connector in which the terminals 5 on the double-faced substrate 4 are inserted.

Also, electronic parts are attached to both the surfaces of the double-faced substrate 4, and as shown in FIG. 10, the double-faced substrate 4 is disposed substantially in the cross-sectional center of the card 1.

The operation of the card and the connector device having the above-described structure will now be described.

As shown in FIG. 10, the card 1 is inserted in the edge connector 6, thereby electrically connecting the terminals 5 with contacts 7 of the edge connector 6.

In the foregoing conventional structure, however, the double-faced substrate 4 must be disposed substantially in the cross-sectional center of the card 1 because, as shown in FIG. 10, the terminals 5 are provided on both the surfaces of the double-faced substrate 4 and inserted, as they are, into the edge connector 6. As a result, there arises a problem that it is difficult to reduce the thickness of the card 1.

If the double-faced substrate 4 is provided in contact with the inner surface of the lower casing 3, terminals 5 disposed on one surface of the double-faced substrate 4 are hidden by the lower casing 3. For this reason, there can be suggested a structure in which an opening is formed in the lower casing 3 in a manner not to contact the lower casing 3 with these terminals 5. With this structure, however, the terminals 5 are exposed, which results in a problem that the terminals are damaged and stained.

SUMMARY OF THE INVENTION

The present invention has been achieved to solve the above-described conventional problems. It is an object of the invention to provide an electronic card which is reduced in thickness and which prevents damages and stains of terminals.

In order to attain the object, an electronic card according to the invention has a structure comprising a casing with an opening, and a double-faced substrate on which electronic parts are provided and a plurality of terminals are attached in the vicinity of one end of the substrate, in which the terminals are provided on both the upper and lower surfaces of the substrate, the lower surface of the substrate is disposed in contact with the inner surface of the casing, and the terminals on the lower surface of the substrate are covered with an openable cover, so that when the card is inserted in a connector, the cover is opened to expose the lower-surface terminals and to fit them closely in the connector.

With the above-described structure, the double-faced substrate can be disposed in contact with or close to the inner surface of the casing so that the thickness of the card can be reduced, and also, the terminals are protected by the cover, thereby preventing damages and stains of the terminals.

BRIEF DESCRIPTION OF THE DRAWINGS

FIG. 3 is an exploded perspective view of the card in FIG. 1;

FIG. 4 is a perspective view showing a guide plate of the connector device in FIG. 1;

DETAILED DESCRIPTION OF THE PREFERRED EMBODIMENTS (Embodiment 1)

Figure 1:
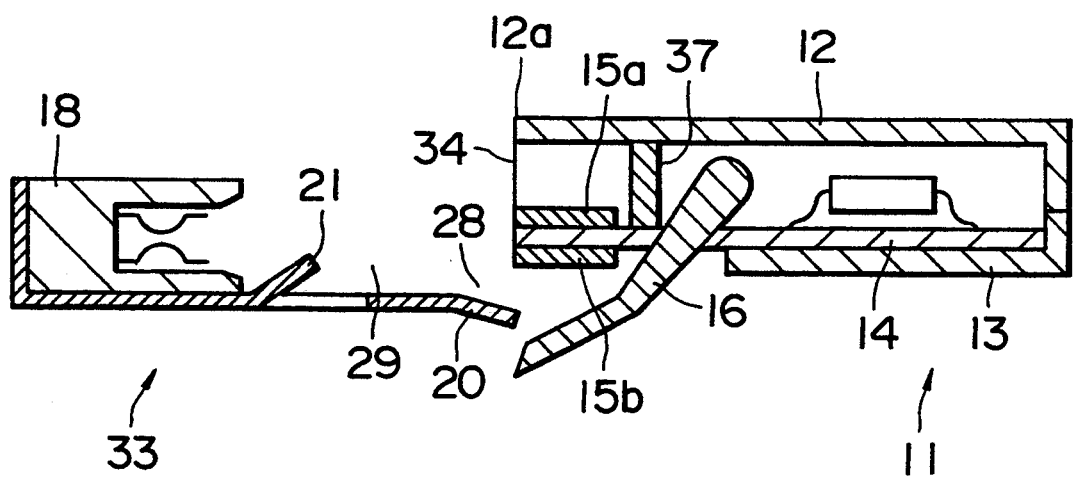
FIG. 1 is a cross-sectional view showing an electronic card and a connector device in a first embodiment according to the present invention.
Figure 2:
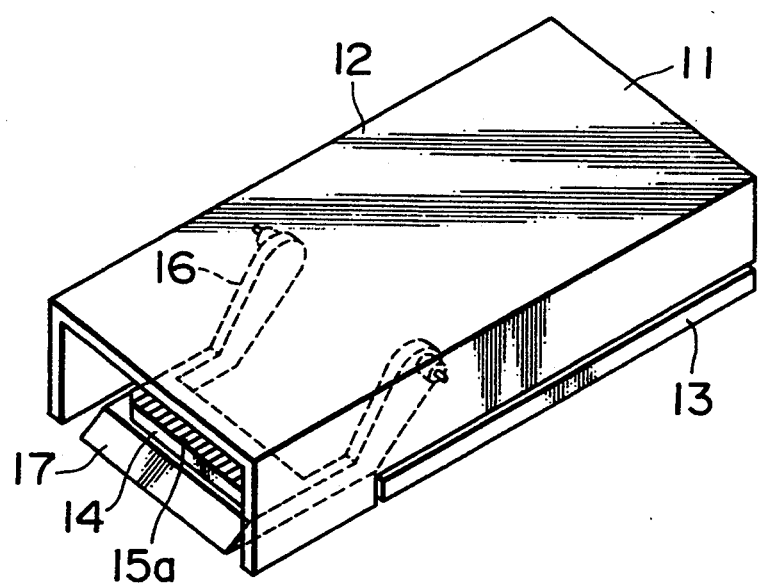
FIG. 2 is a perspective view of the card in FIG. 1.
Figure 5:
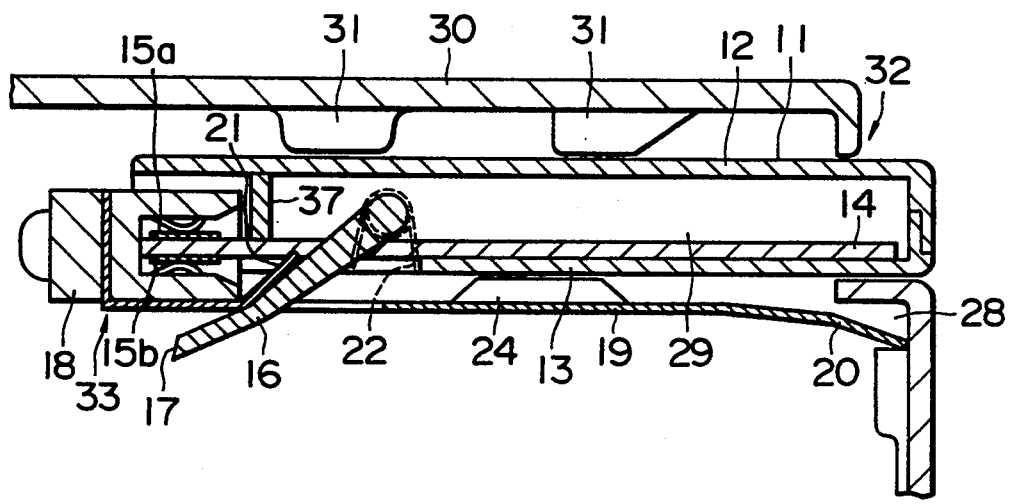
FIG. 5 is a cross-sectional view showing an essential portion of an electronic equipment when the card and the connector device in FIG. 1 are attached to the electronic equipment.

One embodiment according to the present invention will be hereinafter described with reference to the attached drawings. FIG. 1 is a cross-sectional view showing an electronic card 11 according to this embodiment and a connector device 33 in which the card 11 is inserted. FIGS. 2 and 3 are a whole perspective view and an exploded perspective view showing the card 11 according to the invention, respectively. FIG. 4 is a perspective view showing a guide plate of the connector device 33 according to the invention, and FIG. 5 is a cross-sectional view showing an essential portion of an electronic equipment when the card 11 according to the invention and the connector device 33 in which the card 11 is inserted are attached to the electronic equipment. In FIGS. 1 to 5, reference numeral 11 denotes the card, and 12 and 13 denote upper and lower casings which constitute casing means of the card 11, respectively. Reference numeral 14 denotes a double-faced substrate disposed in contact with the inner bottom surface of the lower casing 13 of the card 11, and 15a and 15b denote terminals provided on the top and bottom surfaces of the double-faced substrate 14, respectively. Reference numeral 16 denotes a cover which is attached to the lower casing 13 so as to protect the terminals 15b. The cover 16 can be opened and closed freely and is urged toward the terminals 15b by springs 22. Reference numeral 17 denotes a guide surface which is formed on the distal end of the cover 16 and inclined to function in contact with guide claws 21 of the connector device 33.

Reference numeral 34 denotes an opening formed in one end of the card 11. The height of the opening 34 is such that a connector 18 can be closely fitted to the opening 34.

In this embodiment, an end surface 12a of the casing 12, the guide surface 17 of the cover 16 and the distal ends of the terminals 15a, 15b form substantially the same plane. However, the terminals 15a, 15b may be slightly recessed from the end surface 12a and the guide surface 17.

In this manner, the upper casing 12 and the openable cover 16 protect the terminals 15a, 15b from damages and stains caused from the outside of the card.

A portion of the card 11 at the back of the terminals 15a, 15b may be partitioned by a wall 37 and hermetically sealed to prevent entrance of dust and the like. Further, the guide surface 17 of the cover 16 may be extended to have an L-shaped cross section, thereby covering the opening 34.

Reference numeral 18 denotes the edge connector in which the double-faced substrate 14 is inserted. Reference numeral 19 denotes the guide plate along which the card 11 is introduced into the edge connector 18, and 20 denotes a tapered portion inclined downwardly toward the insertion opening side so that entered water drops are discharged out along the tapered portion 20. Reference numeral 21 denotes the guide claw for opening and closing the cover 16, and 22 denotes the spring which is attached to the upper casing 12 in order to close the cover 16. Reference numerals 23, 24 and 25 in FIG. 4 denote upper, lower and side guide portions for introducing the card 11, respectively, which define a passage 29 of the card 11. The card 11 passes the passage 29 until it is inserted into the edge connector 18. Reference numeral 26 denotes attachment holes for fixing the edge connector 18, and 27 denotes attachment holes for fixing the guide plate 19. Reference numeral 28 denotes an insertion opening from which the card 11 is inserted. In FIG. 5, reference numeral 30 denotes a cover of the electronic equipment on which the guide plate 19 is secured, 31 denotes an upper guide portion provided on the electronic equipment cover 30, along which the card 11 is introduced, and 32 denotes an insertion opening formed in the electronic equipment cover 30 at a position corresponding to the insertion opening 28 of the guide plate 19.

The operation of the card and the connector device having the above-described structure will now be described with reference to FIGS. 3, 4 and 5.

First, the card 11 will be explained. The double-faced substrate 14 on which electronic parts and the terminals 15a, 15b are provided is closely fitted to and disposed on the inner surface of the lower casing 13. At this time, only the lower-surface terminals 15b of the double-faced substrate 14 which is mounted on the inner surface of the lower casing 13 in close contact, are not in contact with the lower casing 13 but exposed. Then, the springs 22 are interposed between the cover 16 and the upper casing 12 so as to urge the cover 16 toward the terminals 15b. Next, the lower casing 13 is inserted in the upper casing 12, thereby assembling the card 11. The terminals 15b of the assembled card 11 are protected by the openable cover 16, and consequently, there is no fear of damages and stains. Further, since the double-faced substrate 14 is disposed in contact with the inner surface of the lower casing 13, the height limit by the electronic parts is lessened as compared with the conventional example, thereby reducing the size of the card 11.

Next, the connector device 33 will be explained. The edge connector 18 is fixed on the guide plate 19 by screw-fastening the edge connector 18 in the attachment holes 26 of the guide plate 19. Then, the guide plate 19 is fixed on the electronic equipment cover 30 by screw-fastening the guide plate 19 in the electronic equipment cover 30 through the attachment holes 27 of the guide plate 19.

As a result, the insertion opening 28 of the guide plate 19 aligns with the insertion opening 32 of the electronic equipment cover 30 so that the card 11 can be inserted from the openings. Then, the card 11 passes the insertion opening 32 of the electronic equipment cover 30, passes the insertion opening 28 of the guide plate 19, and passes the passage 29 continuously formed from the insertion opening 28. Thus, the card 11 is inserted in the edge connector 18 provided at the back of the passage 29.

At this time, the bottom of the card 11 is moved along the lower guide portions 24 of the guide plate 19, both the sides of the card 11 are moved along the side guide portions 25, and the top of the card 11 is moved along the upper guide portions 31 of the electronic equipment cover 30. Consequently, the card 11 can be easily and accurately introduced into a correct position in the edge connector 18.

Further, the guide surface 17 of the cover 16 protecting the terminals 15b is moved down along the opening/closing guide claws 21 of the guide plate 19 which are provided just before the edge connector 18, thereby opening the cover 16 and exposing the terminals 15b. Thus, the terminals 15a, 15b of the double-faced substrate 14 are reliably inserted in the edge connector 18.

When detaching the card 11, the cover 16 which is urged toward the terminals 15a, 15b by the springs 22 is gradually closed along the opening/closing guide claws 21. When the cover 16 is detached from the opening/closing guide claws 21, the cover 16 is bought into contact with the terminals 15b and returned into the condition for protecting the terminals 15b.

That is to say, by means of the opening/closing guide claws 21, forward and backward movements of the card 11 along the guide plate 19 are converted into opening and closing movements of the cover 16 protecting the terminals 15b, thereby exposing and covering the terminals 15b. Therefore, damages and stains of the terminals 15b can be prevented, and also, the terminals 15a, 15b of the double-faced substrate 14 can be reliably inserted in the edge connector 18.

A distance B between outer edges of the opening/closing guide claws 21 (in FIG. 4) is made smaller than a distance A between inner surfaces of opposite walls of the upper casing 12 (in FIG. 3), and a distance C between inner edges of the opening/closing guide claws 21 (in FIG. 4) is made larger than a width D of the double-faced substrate 14 (in FIG. 3). Consequently, the opening/closing guide claws 21 can effect only the opening/closing movements of the cover 16 without interfering movements of the upper casing 12 and the double-faced substrate 14.

Moreover, the tapered portion 20 is provided on the bottom of the insertion opening 28 of the guide plate 19. Therefore, if liquid flows in from the insertion opening 28, it will not enter into the device but will be discharged out along the tapered portion 20. Consequently, even if the electronic equipment cover 30 to which the card 11 is attached includes the insertion opening 32, it is possible to prevent liquid from flowing into electronic circuits inside of the electronic equipment cover 30, thus eliminating fear of troubles and operational errors.

Instead of the upper guide portions 31 of the electronic equipment cover 30, the top of the card 11 may be moved along the upper guide portions 23 formed on the guide plate 19 (in FIG. 4).

According to this embodiment, as described above, the double-faced substrate 14 is disposed in contact with the inner surface of the lower casing 13 of the card 11 so that the card 11 can be decreased in size.

Further, by means of the opening/closing guide claws 21, forward and backward movements of the card 11 along the guide plate 19 are converted into opening and closing movements of the cover 16 so that damages and stains of the terminals 15b can be prevented.

(Embodiment 2)

Figure 6:
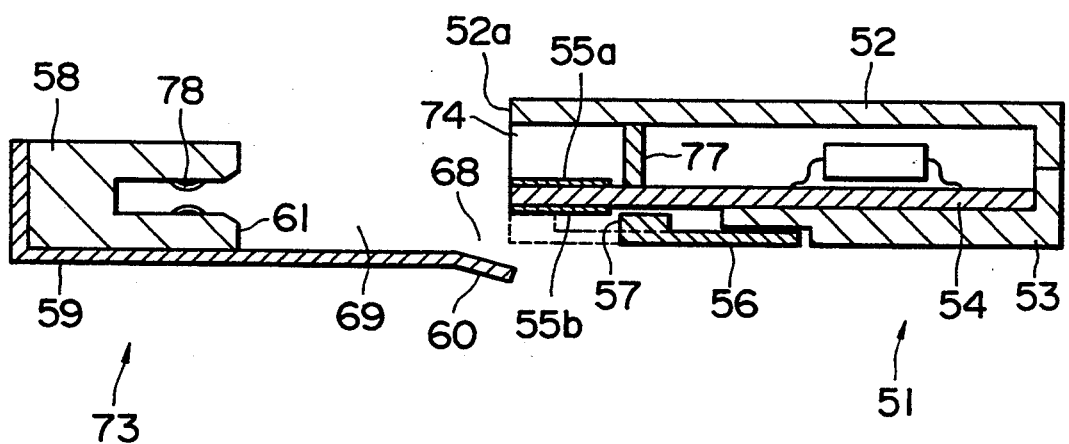
FIG. 6 is a cross-sectional view showing an electronic card and a card-insertable connector device in a second embodiment according to the invention.
Figure 7:
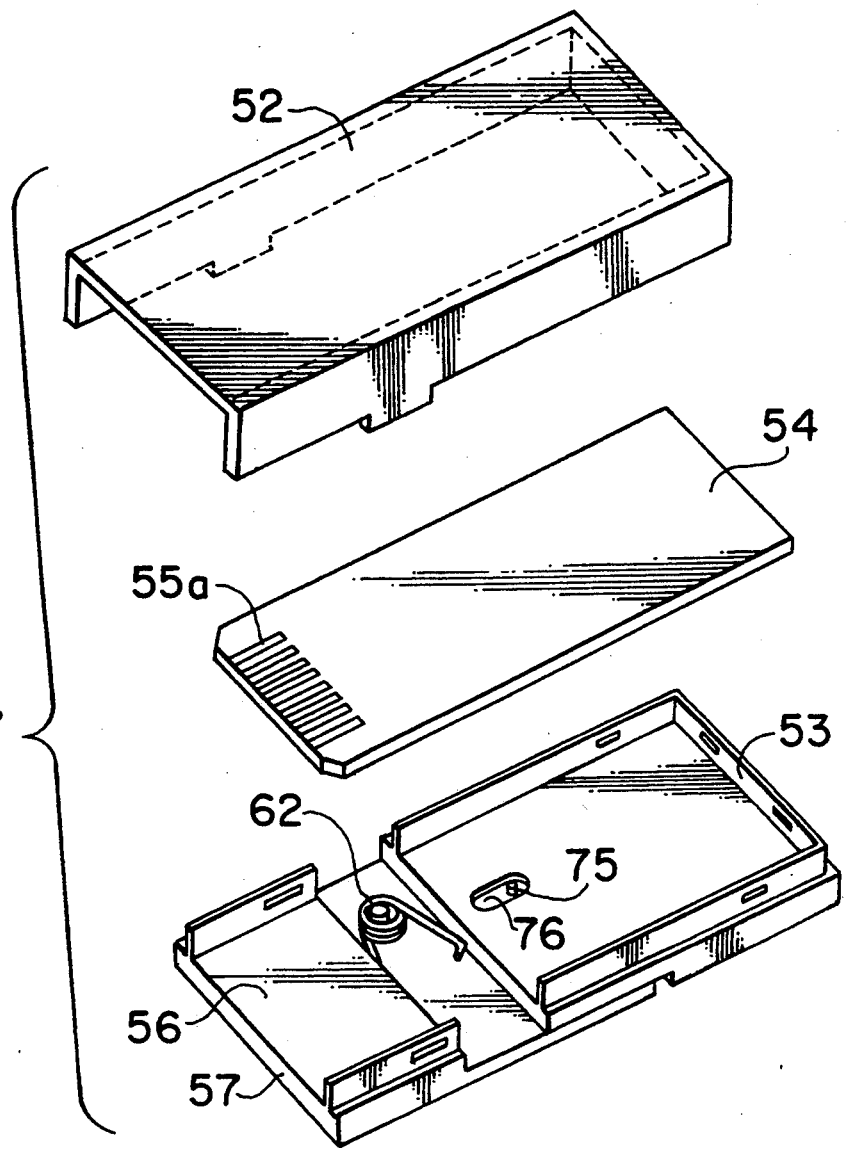
FIG. 7 is an exploded perspective view of the card in FIG. 6.
Figure 8:
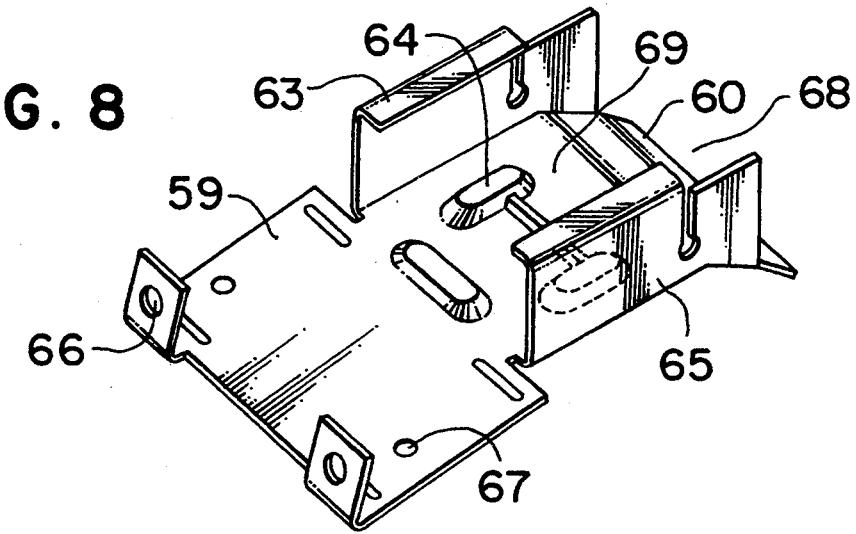
FIG. 8 is a perspective view showing a guide plate of the connector device in FIG. 6.
Figure 9:
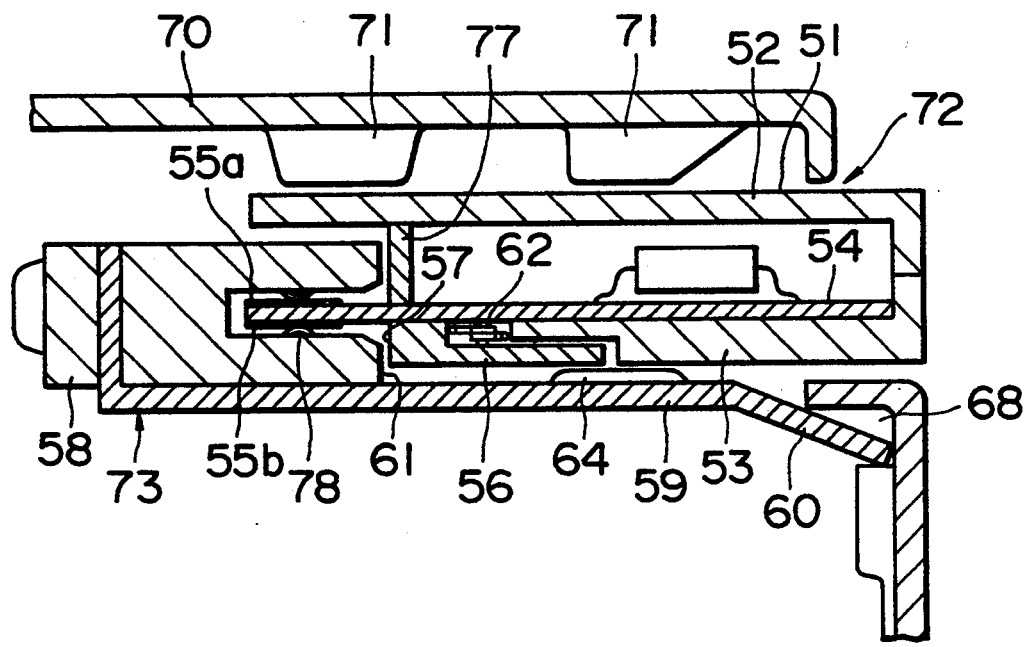
FIG. 9 is a cross-sectional view showing an essential portion of an electronic equipment when the card and the connector device in FIG. 6 are attached to the electronic equipment.
Figure 10:
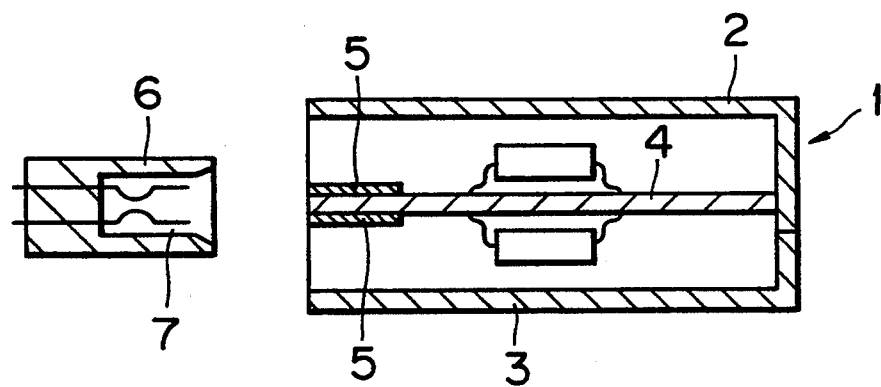
FIG. 10 is a cross-sectional view showing a conventional electronic card and a connector device in which the conventional card is inserted.

A second embodiment according to the present invention will be hereinafter described with reference to the attached drawings. FIG. 6 is a cross-sectional view showing an electronic card 51 according to the second embodiment and a connector device 73 in which the card 51 is inserted, and FIG. 7 is an exploded perspective view showing the card 51 according to the invention. FIG. 8 is a perspective view showing a guide plate 59 of the connector device 73 according to the invention, and FIG. 9 is a cross-sectional view showing an essential portion of an electronic equipment when the card 51 according to the invention and the connector device 73 in which the card 51 is inserted are attached to the electronic equipment. In FIGS. 6 to 9, reference numeral 51 denotes the card, and 52 and 53 denote upper and lower casings which constitute casing means of the card 51, respectively. Reference numeral 54 denotes a double-faced substrate disposed in contact with the inner bottom surface of the lower casing 53 of the card 51, and 55a and 55b denote upper and lower terminals provided on the top and bottom surfaces of the double-faced substrate 54, respectively. Reference numeral 56 denotes a cover which is attached to the lower casing 53 so as to protect the lower terminals 55b. The cover 56 can be opened and closed freely and is urged toward the distal ends of the lower terminals 55b by a spring 62. Reference numeral 57 denotes a distal end surface of the cover 56, which abuts against an end surface 61 of an edge connector 58 of the connector device 73 so as to perform the cover opening operation. Reference numeral 74 denotes an opening formed in one end of the card 51. The height of the opening 74 is such that the connector 58 can be closely fitted to the opening 74.

In this embodiment, an end surface 52a of the upper casing 52, the end surface 57 of the cover 56 and the distal ends of the upper and lower terminals 55a, 55b form substantially the same plane. However, the upper and lower terminals 55a, 55b may be slightly recessed from the end surface 52a and the end surface 57.

In this manner, the upper casing 52 and the slidable cover 56 protect the upper and lower terminals 55a, 55b from damages and stains caused from the outside of the card.

A portion of the card 51 at the back of the upper and lower terminals 55a, 55b may be hermetically sealed by a wall 77 to prevent dust and the like from entering into the electronic parts. Reference numeral 58 denotes the edge connector in which the upper and lower terminals 55a, 55b of the double-faced substrate 54 are inserted. In FIGS. 8 and 9, reference numeral 59 denotes the guide plate along which the card 51 is introduced into the edge connector 58, and 60 denotes a tapered portion along which entered water drops are discharged out of the electronic equipment. Reference numeral 61 denotes the end surface of the edge connector 58 for opening and closing the cover 56. In FIG. 7, reference numeral 62 denotes the spring which is attached to the lower casing 53 in order to urge the cover 56 toward the distal ends of the upper and lower terminals 55a, 55b. In FIG. 8, reference numerals 63, 64 and 65 denote upper, lower and side guide portions for introducing the card 51, respectively, which define a passage 69 of the card 51. The card 51 is inserted into the edge connector 58 through the passage 69. Reference numeral 66 denotes attachment holes for fixing the edge connector 58, and 67 denotes attachment holes for fixing the guide plate 59. Reference numeral 68 denotes an insertion opening from which the card 51 is inserted. In FIG. 9, reference numeral 70 denotes a cover of the electronic equipment on which the guide plate 59 is secured, 71 denotes an upper guide portion provided on the electronic equipment cover 70, along which the card 51 is introduced, and 72 denotes an insertion opening communicating with the electronic equipment, which is formed at a position corresponding to the insertion opening 68 of the guide plate 59.

The operation of the card and the connector device therefor having the above-described structure will now be described with reference to FIGS. 7, 8 and 9.

First, the card 51 will be explained. The double-faced substrate 54 on which electronic parts and the upper and lower terminals 55a, 55b are provided is closely fitted to and disposed on the inner surface of the lower casing 53. At this time, only the lower terminals 55b on the distal end of the double-faced substrate 54 which is mounted on the inner surface of the lower casing 53 in close contact, are not in contact with the lower casing 53 but exposed. Then, the spring 62 is interposed between the cover 56 and the lower casing 53 so as to urge the cover 56 toward the distal ends of the lower terminals 55b. Next, the lower casing 53 and the cover 56 are fitted in the upper casing 52, thereby assembling the card 51. The lower terminals 55b of the assembled card 51 are protected by the openable cover 56 which can be slid horizontally, and consequently, there is no fear of damages and stains. Further, since the double-faced substrate 54 is disposed in contact with the inner surface of the lower casing 53, the size of the card 51 can be reduced.

Next, the connector device 73 will be explained. The edge connector 58 is fixed on the guide plate 59 by screw-fastening the edge connector 58 in the attachment holes 66 of the guide plate 59. Then, the guide plate 59 is fixed on bosses (not seen) projecting downwardly from the electronic equipment cover 70 by screw-fastening the guide plate 59 in the electronic equipment cover 70 through the attachment holes 67 of the guide plate 59.

As a result, the insertion opening 68 of the guide plate 59 aligns with the insertion opening 72 of the electronic equipment cover 70 so that the card 51 can be inserted from the openings. Then, the card 51 passes the insertion opening 72 of the electronic equipment cover 70, passes the insertion opening 68 of the guide plate 59, and passes the passage 69 continuously formed from the insertion opening 68. Thus, the card 51 is inserted in the edge connector 58 provided at the back of the passage 69.

At this time, the bottom of the card 51 is moved along the lower guide portions 64 of the guide plate 59, both the sides of the card 51 are moved along the side guide portions 65, and the top of the card 51 is moved along the upper guide portions 71 of the electronic equipment cover 70. Consequently, the card 51 can be easily and accurately introduced into a correct position in the edge connector 58.

Further, the end surface 57 of the cover 56 protecting the lower terminals 55b is brought into contact with the end surface 61 of the guide plate 59 which is formed just before the edge connector 58, and the cover 56 is slid in a direction reverse to the insertion direction. As a result, the cover 56 is opened, and the lower terminals 55b are exposed, so that the upper and lower terminals 55a, 55b of the double-faced substrate 54 are reliably inserted in the edge connector 58 and electrically connected to contacts 78.

When detaching the card 51, as shown in FIGS. 7 and 9, the cover 56 which is urged toward the distal ends of the upper and lower terminals 55a, 55b by the spring 62 is gradually closed along the end surface 61 of the edge connector 58. When the end surface 57 of the cover 56 is detached from the end surface 61, the cover 56 recovers the initial position and is returned into the condition for protecting the lower terminals 55b. The movable range of the cover 56 can be limited to the length of a guide groove 76 because a guide pin 75 of the cover 56 is fitted in the guide groove 76 formed in the lower casing 53.

That is to say, by means of the end surface 61 of the edge connector 58, forward and backward movements of the card 51 along the guide plate 59 are converted into horizontal sliding opening and closing movements of the cover 56 protecting the lower terminals 55b, thereby exposing and covering the lower terminals 55b. Therefore, damages and stains of the lower terminals 55b can be prevented, and also, the upper and lower terminals 55a, 55b of the double-faced substrate 54 can be reliably inserted in the edge connector 58.

Moreover, a tapered portion 60 is provided on the bottom of the insertion opening 68 of the guide plate 59. Therefore, if liquid flows in from the insertion opening 68, it will not enter into the device but will be discharged out along the tapered portion 60. Consequently, even if the electronic equipment cover 70 to which the card 51 is attached includes the insertion opening 72, it is possible to prevent liquid from flowing into electronic circuits inside of the electronic equipment, thus eliminating fear of troubles and operational errors.

Instead of the upper guide portions 71 of the electronic equipment cover 70, the top of the card 51 may be moved along the upper guide portions 63 formed on the guide plate 59 (in FIG. 8).

According to this embodiment, as described above, the double-faced substrate 54 is disposed in contact with the inner surface of the lower casing 53 of the card 51 so that the card 51 can be decreased in size.

Further, by means of the end surface 61 of the edge connector 58, forward and backward movements of the card 51 along the guide plate 59 are converted into horizontal sliding opening and closing movements of the cover 56 so that damages and stains of the lower terminals 55b can be prevented.

As described heretofore, the electronic card according to the present invention has the structure comprising the casing with the opening, and the double-faced substrate on which electronic parts are provided and a plurality of terminals are attached in the vicinity of one end of the substrate, in which the terminals are provided on both the upper and lower surfaces of the substrate, the lower surface of the substrate is disposed in contact with the inner surface of the casing, the terminals on the lower surface of the substrate are covered with the cover which is swung or slid to be opened/closed freely, so that when the card is inserted in the connector, the cover is opened to expose the lower-surface terminals and to fit them closely in the connector. Therefore, the thickness or size of the card can be reduced.

Moreover, since the casing having the exposed terminals is provided with the openable cover, there is no fear of damages and stains of the terminals.

What is claimed is:

1. An electronic card comprising a casing and a double-faced substrate on which electronic parts are provided and a plurality of terminals are attached in the vicinity of one end of the substrate, wherein said terminals are provided on both upper and lower surfaces of said substrate, the lower surface of said substrate is disposed in contact with an inner surface of said casing, said terminals on the lower surface of said substrate are covered with an openable cover, so that when the electronic card is inserted in a connector, said cover is opened to expose said terminals on the lower surface of said substrate and to fit them closely to the connector.

2. An electronic card according to claim 1, wherein said cover which covers said terminals on the lower surface of said substrate is swingable so that when the electronic card is attached to and detached from said connector, said cover is accordingly swung to be opened and closed.

3. An electronic card according to claim 2, wherein said electronic parts are partitioned from said terminals on the upper surface of said substrate so as to hermetically seal the electronic card.

4. A connector device into which the electronic card according to claim 2 is inserted, comprising an insertion opening for receiving the electronic card, a passage connected to said insertion opening, and a connector to which terminals of the electronic card are closely fitted, said connector being provided at a back of said passage, wherein guide claws for either opening or closing the cover of the electronic card are provided on said passage so that when the electronic card is inserted in said connector, said cover is swung and opened by the guide claws so as to expose the terminals on the lower surface of said substrate and to fit them closely to said connector.

5. A connector device according to claim 4, wherein said insertion opening has a distal end with a bottom surface and the bottom surface of the distal end of said insertion opening has a tapered portion which is inclined downwardly toward a front of said passage.

6. An electronic card according to claim 1, wherein said cover is slidable in a direction reverse to the insertion direction of the electronic card so that when the electronic card is inserted in said connector, said cover is slid and opened.

7. An electronic card according to claim 6, wherein said cover is urged toward distal ends of said terminals.

8. An electronic card according to claim 6, wherein said electronic parts are partitioned from said terminals on the upper surface of said substrate so as to hermetically seal the electronic card.

9. A connector device into which the electronic card according to claim 4 is inserted, comprising an insertion opening for receiving the electronic card, a passage connected to said insertion opening, and a connector to which terminals of the electronic card are closely fitted, said connector being provided at a back of said passage, wherein the cover is slid and opened when the electronic card is inserted in said connector, so as to expose the terminals on the lower surface of said substrate and to fit them closely to said connector.

10. A connector device according to claim 9, wherein said insertion opening has a distal end with a bottom surface and the bottom surface of the distal end of said insertion opening has a tapered portion which is inclined downwardly toward a front of said passage.

* * * * *